United States Patent
Jang

(10) Patent No.: US 6,931,349 B2
(45) Date of Patent: Aug. 16, 2005

(54) JITTER MEASURING SYSTEM IN HIGH SPEED DATA OUTPUT DEVICE AND TOTAL JITTER MEASURING METHOD

(75) Inventor: Jin-Mo Jang, Bucheon (KR)

(73) Assignee: Samsung Electronics Co., Ltd. (KR)

( * ) Notice: Subject to any disclaimer, the term of this patent is extended or adjusted under 35 U.S.C. 154(b) by 72 days.

(21) Appl. No.: 10/426,411

(22) Filed: Apr. 30, 2003

(65) Prior Publication Data

US 2004/0019458 A1 Jan. 29, 2004

(30) Foreign Application Priority Data

Jul. 24, 2002 (KR) ........................................ 2002-43475

(51) Int. Cl.$^7$ .............................................. G06F 11/30
(52) U.S. Cl. ...................................................... 702/142
(58) Field of Search ................................ 702/142, 120, 702/117, 190, 122, 182, 124, 123; 341/163, 51, 123; 375/224; 365/45; 714/726, 724, 744, 701; 324/763, 76, 158, 77, 703; 315/500

(56) References Cited

U.S. PATENT DOCUMENTS

| | | | | |
|---|---|---|---|---|
| 4,329,654 A | * | 5/1982 | Chamberlain | ............... 315/500 |
| 5,578,935 A | * | 11/1996 | Burns | ........................ 324/763 |
| 5,589,763 A | | 12/1996 | Burns | ..................... 324/76.15 |
| 5,740,086 A | * | 4/1998 | Komoto | ..................... 702/120 |
| 5,768,155 A | * | 6/1998 | Becker | ....................... 702/190 |
| 5,923,706 A | | 7/1999 | März | ......................... 375/226 |
| 6,185,510 B1 | | 2/2001 | Inoue | ......................... 702/69 |
| 2003/0020459 A1 | * | 1/2003 | Lambert | ................. 324/158.1 |

\* cited by examiner

*Primary Examiner*—John Barlow
*Assistant Examiner*—Tung S. Lau
(74) *Attorney, Agent, or Firm*—Mills & Onello LLP

(57) ABSTRACT

In a system and method for measuring total litter in a high speed data processing device, a high-speed data processing device, as an object under test, receives test data and generates differential output data at a high rate. A test device provides the test data to the high speed data processing device and provides a comparison operation reference clock. A high-speed differential comparator is coupled between the high speed data processing device and the test device for comparing the differential output data of the high speed data processing device in response to the comparison operation reference clock. In this manner, measurement of total jitter in a high speed data processing device can be achieved rapidly and without the need for employing a high-cost measuring instrument.

11 Claims, 4 Drawing Sheets

JITTER MEASURING SYSTEM IN HIGH SPEED DATA OUTPUT DEVICE AND TOTAL JITTER MEASURING METHOD

BACKGROUND OF THE INVENTION

1. Field of the Invention

The present invention relates to testing of semiconductor devices, and more particularly, to a jitter measuring system and a total jitter measuring method in a high speed data output device.

2. Prior Art of the Invention

In general, jitter generated during operation of an integrated circuit is a type of noise. It is well known that such jitter can cause an error, or data loss, during operation. For this reason, accurate measurement of jitter generated in an integrated circuit device is desired.

In a high speed data processing device having a data speed on the order of 1 GHz or greater, e.g., a parallel/serial converter etc., in the case where total jitter of output data is measured by automated test equipment (ATE), it is highly desired during testing that jitter be measured to high accuracy. The total jitter of a system can be categorized into "DJ" (Deterministic Jitter) and "RJ" (Random Jitter). DJ jitter can be subcategorized into PJ (Periodic Jitter) and DDJ (Data Dependent Jitter). DDJ is generally composed of components of DCD (Duty Cycle Distortion) and ISI(InterSymble Interference).

In mixed tester systems, jitter measurement is commonly performed only for the determination of random jitter (RJ) and the periodic jitter (PJ) of data that has a lower speed below 1 GBPS. For this reason, data dependent jitter (DDJ), which is an important influence upon the total jitter characteristics cannot be measured precisely.

In order to measure the total jitter more precisely, conventionally, as shown in FIG. 1, a measuring instrument 20 is coupled with an ATE(automated test equipment) test device 30 as a mixed tester system. The measuring instrument 20 is connected to a data output device, such as a DUT (Device Under Test) 10. The test device 30 applies a control signal to the measuring instrument 20 through a GPIB (General Purpose Interface Bus), and receives measured result data. When the control signal is transferred to the measuring instrument 20 from the test device 30 through the GPIB, the total jitter measured by the measuring instrument 20 is transmitted to the test device 30.

The conventional method of measuring the total jitter (TJ) of a DUT 10 through a use of the measuring instrument 20 is capable of accurate measurement of the jitter, to a certain degree, however, this configuration requires the additional cost for a specific installment of the measuring instrument 20, and a great deal of stand-by time for the test device 30 in order to measure the jitter through the measuring instrument 20.

Such conventional jitter measuring method requires a measuring instrument capable of measuring the total jitter of high speed data at a rate of over 2.0 Gbps. For this and other reasons, there is a problem with cost increase due to the additional installation of the measuring instrument, and of a increase in time consumed by the test in gaining the result through the test device.

SUMMARY OF THE INVENTION

It is therefore an object of the present invention to provide a jitter measuring system and method, which are capable of addressing the limitations of the conventional approaches.

Another object of the present invention is to provide a jitter measuring system and a total jitter measuring method in a high speed data device.

Another object of the present invention is to provide an improved jitter measuring system and a total jitter measuring method therefor, which is capable of measuring total jitter of high speed data at a rate of over 2.0 Gbps, in a comparatively short time period.

An additional object of the present invention is to provide a total jitter measuring method, in which even data dependent jitter (DDJ), which is an important influence on total jitter characteristics, can be accurately measured.

In one aspect, the present invention is directed to a system for measuring jitter in a high speed data processing device. A high-speed data processing device, as an object under test, receives test data and generates differential output data at a high rate. A test device provides the test data to the high speed data processing device and provides a comparison operation reference clock. A high-speed differential comparator is coupled between the high speed data processing device and the test device for comparing the differential output data of the high speed data processing device in response to the comparison operation reference clock.

In one embodiment, the comparison operation reference clock has a clock rate that is less than the rate of the output rate of the differential output data, such that the comparison operation reference clock undersamples the output data. The high speed data processing device comprises a converter for converting parallel data into serial data. The test device captures comparison output data undersampled by the high speed comparator, and, in response, measures total jitter.

In another embodiment, the comparison operation reference clock operates at a frequency that is determined as 1/[I*(n−K)*period per 1 bit] in testing an n-bit high speed data processing device, in order to overlap and capture data of mutually different bits.

The test data may comprise data wherein binary values of "1" and "0" are alternatively repeated, so as to generate repetitive differential output data.

In another aspect, the present invention is directed to a method of measuring a total jitter in a high speed data processing device. A differential comparator is coupled to a differential output terminal of the high speed data processing device. Test data are applied to the high speed data output device so as to generate alternating output data at the differential output terminal. An operating period of the differential comparator is set to be more than one output period of the alternating output data output by the differential output terminal, so as to undersample the output data of the high speed data processing device to generate undersampled comparison data. Bits of the undersampled comparison data are overlapped and captured in order to measure the total jitter of the high speed data processing device.

Such systematic and methodic construction allows for measurement of the total jitter of the high speed data output in a relatively short time without the need for employing a high cost measuring instrument.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF PREFERRED EMBODIMENTS

Figure 1:
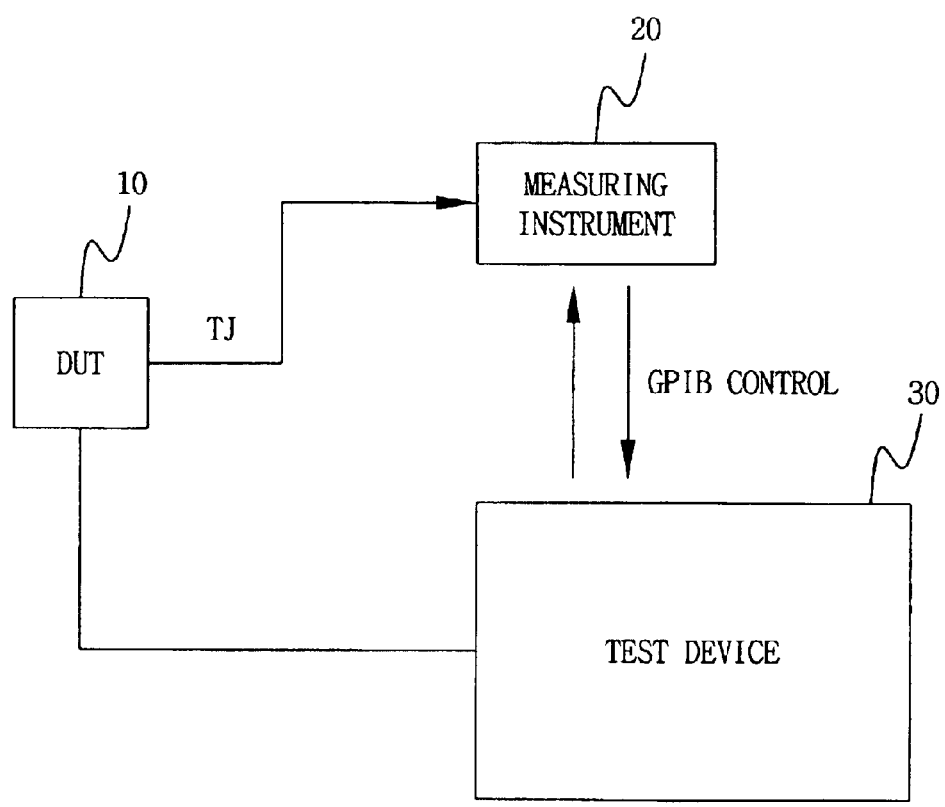
FIG. 1 is a block diagram of a conventional jitter measuring system.

Hereinafter, preferred embodiments of the present invention will be described in detail with reference to the accompanying drawings.

In accordance with the preferred embodiments of the present invention, a jitter measuring system in a high speed data output device and a total jitter measuring method will be described with the same or similar reference characters and numbers for constructive elements which have the same or similar functions even, on mutually different drawings.

Figure 2:
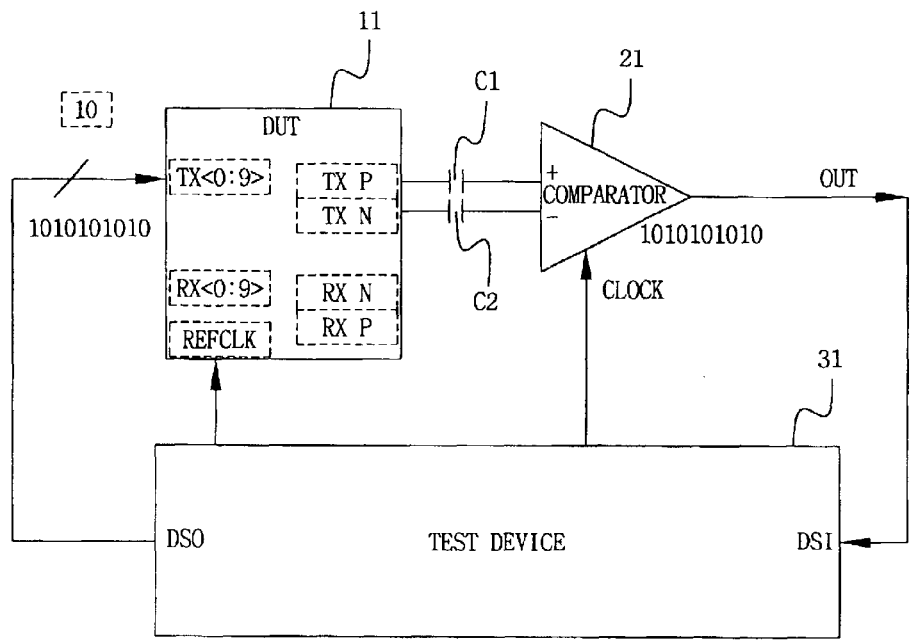
FIG. 2 is a block diagram of a jitter measuring system in accordance with the present invention.
Figure 3:
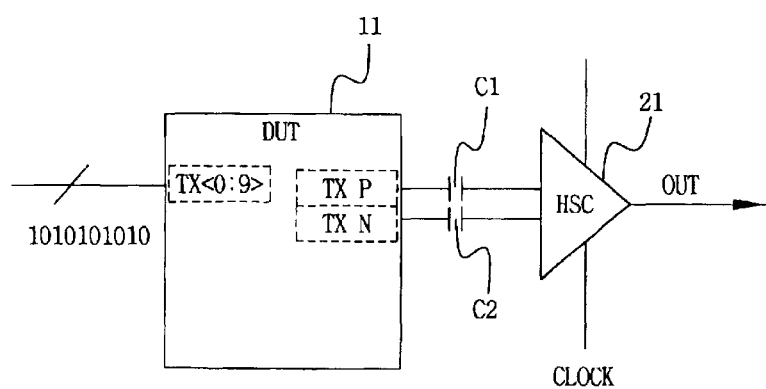
FIG. 3 is a schematic diagram showing a detailed connection with the comparator of FIG. 2.

FIG. 2 is a block diagram of a jitter measuring system according to an embodiment of the present invention. FIG. 3 is a schematic diagram of a detailed connection in relation to the comparator of FIG. 2. FIGS. 2 and 3 provide the construction of the jitter measuring system using a high speed comparator without the need for employing the conventional measuring instrument 20. A high speed data output device DUT 11 as the tested object is connected to a test device 31 for providing testing data DSO and a comparison operation reference clock CLOCK. A comparator 21 installed on a test board is coupled between the high speed data output device 11 and the test device 31. The comparator 21 compares differential output data output at output pins TX P, TX N of the high speed data output device 11 in response to the comparison operation reference clock CLOCK. The comparator 21 further applies its comparison result to a data input terminal DSI of the test device 31.

The high speed data output device DUT 11 may comprise, for example, a parallel/serial converter, e.g., a "SERDES" device. In this embodiment, the use of a single high-speed differential comparator 21 enables the measurement of a jitter component caused by a mismatch of output signals at the output pins TX P, TX N. Capacitors C1, C2 may be include din series with the signal path, as shown, to provide for DC coupling in order to eliminate a DC component signal.

Input terminals +, − of the dual high-speed comparator 21 are connected to correspond with the output pins TX P, TX N of the DUT 11. In addition, the comparison operation reference clock CLOCK is applied to a clock terminal of the comparator 21, the comparison operation reference clock CLOCK having a frequency that is slower than the frequency of the serial data output by the output pins TX P, TX N. Under such a configuration, an output OUT of the comparator 21 has an undersampled result. That is, the test device 31 can measure the total jitter of the DUT by capturing the undersampled comparison output waveform.

The reason for using the comparator 21 as the jitter measurement device is as follows. A general SERDES high speed serial data pin structure is provided with differential pins so as to magnify tolerance against noise. Therefore the dual high speed comparator measures jitter caused by zero cross point mismatch between the two pins. In one example, the omparator 21 may comprise the "9689" unit as available from the SPT company, wherein "9689" performs a comparison operation in response to a variable comparison operation reference clock CLOCK and outputs digital data as its comparison operation result.

Selection of the optimum undersampling rate is further required-to more exactly measure the total jitter, since an inexact undersampling rate, while valid for measurement of the RJ component, may be inadequate for measurement of the DJ component.

The RJ measurement in the conventional fiber channel SERDES was performed by using serial data as pattern data of "+K28.7(0011111000)" and "−K28.7(1100000111)" based on a clock type. Further the DJ measurement was performed by using pattern data of "+K28.5(0011111010)" and "−K28.5(1100000101)". Conventionally, thus, all patterns, +K28.5 and −K28.5 had to be used in order to measure the total jitter containing DJ and RJ. In case that the total jitter was measured by using the pattern of K28.5 in an n-bit SERDES, undersampling frequency was adjusted so as to be undersampled by a unit of n*M bits, wherein M is an integer. In this manner, the data were successfully captured. That is, the conventional method is valid to measure RJ and a portion of DJ but invalid to measure the jitter of all bits. Meanwhile, in another conventional total jitter measuring approach that uses a measuring instrument such as an oscilloscope etc., eye jitter is measured by overlapping data of mutually different bits and generating an eye-diagram. As afore-mentioned, this approach has associated with it the problem of costs increase caused by the need for installment of the measuring instrument, and also has the problem of a prolonged testing time owing to a difficulty in testing the high speed data output device.

In the embodiment of the present invention, however, the SERDES pattern data and the undersampling frequency are controlled so as to overlap and capture the data of mutually different bits. The undersampling frequency herewith indicates the comparison operation reference clock CLOCK. In the case of the inventive embodiment, in testing the n-bit SERDES, the undersampling frequency can be determined as 1/(I*(n−K)*period per 1 bit), where I is an integer greater than 1, and where K is an even-order integer less than n. Under such a determination, the data of mutually different bits can be overlapped and captured. That is, data of the same bits are not overlapped and captured, but the data of mutually different bits are overlapped and captured to thus measure the total jitter.

The SERDES pattern data represents the testing data. The SERDES pattern data is decided as the inferior pattern data that generates the total jitter containing RJ and DJ. The SERDES pattern data utilized in the exemplary inventive embodiment is provided by "1010101010" or "0101010101" so as to generate the repetitive output data.

Figure 4:
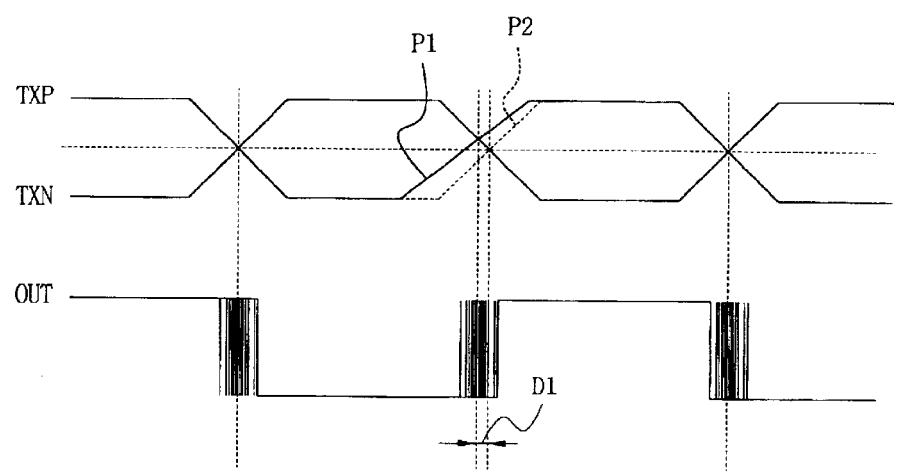
FIG. 4 is a timing diagram illustrating input and output data waveforms of the comparator shown in FIGS. 2 and 3.

FIG. 4 is a timing diagram that illustrates the input and output data waveforms of the comparator 21 in the construction of FIGS. 2 and 3. FIG. 4 represents the case where a rising event P1 on a second bit of the TXP pin is generated prior to an ideal event P2. In this example, the differential output data crossed at a higher point on the curve that the zero cross point, rather than crossing at the zero cross point. In this case, jitter is generated at jitter section D1 caused by the mismatch of the differential output pins. In this case, if only the TX N pin was connected to the comparator, the jitter caused by the TXP pin would be impossible to measure.

However, in the case of the present invention, if the differential comparator 21 is used as shown in FIGS. 2 and 3, output data "0" or "1" can be captured and so the jitter caused by the mismatch of the differential output data can be measured. That is, to maximally utilize the merits of the differential structure, the cross point of the differential pin output data is at the zero cross point. If the output data cross point is not at the zero cross point, the jitter caused by the mismatch of the signals on the two pins occurs, and this jitter is reflected at the output of the comparator 21 having the differential input.

The method of measuring the total jitter of a device, for example, a SERDES device, will now be described. The jitter for all bits should be measured in order to measure the SERDES total jitter. This will now be explained in connection with an example of a 10 bits 2.125 GHz BPS SERDES test.

Data for all bits should be overlapped and captured in order to measure the total jitter of all bits. In order to overlap and capture data of all bits by using the high speed differential comparator 21, it is preferred that the SERDES input data are selected as the pattern data containing all of the DJ and RJ components. In the inventive embodiment, data such as "1010101010" and "0101010101" is selected and is applied to the DUT 11. At this time, the output data of the DUT 11 is therefore the repetitive data of 10 bits output in series. The undersampling frequency can be herewith adjusted to be sampled every 8 bits as shown in FIG. 5.

Figure 5:
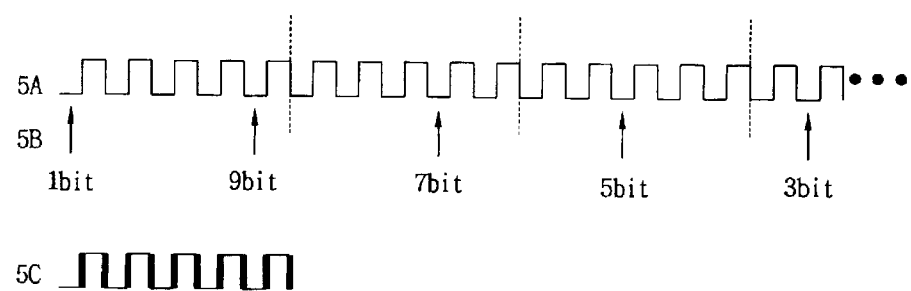
FIG. 5 is a timing drawing illustrating undersampled and captured data for 10-bit data in measuring a total jitter in an embodiment of the present invention.

FIG. 5 is a timing diagram for illustrating undersampling and the data capture of 10 bits data every 8 bits in order to measure the total jitter in the embodiment of the present invention. In FIG. 5, waveform 5A indicates the SEREDES output data and has a repetitive waveform of "1" and "0". Waveform 5B shows data capture points and undersampling at every 8 bits. In this case, all levels of the undersampled data are at low levels. Waveform 5C provides output data of the comparator 21, and data of all bits are overlapped and captured. The position of the captured bit can optionally be changed at any time. Since an edge point having a jitter component in the captured data is not an edge of a specific bit but an overlapped portion of the edges of all bits, the desired total jitter can be measured. Measuring the jitter by overlapping the data of several bits has a concept equal to the eye jitter provided as the total jitter measured in the measuring instrument, e.g., oscilloscope. Accordingly, even the data dependent jitter DDJ having an importantly influence on the characteristic of the total jitter can be measured accurately.

Figure 6:
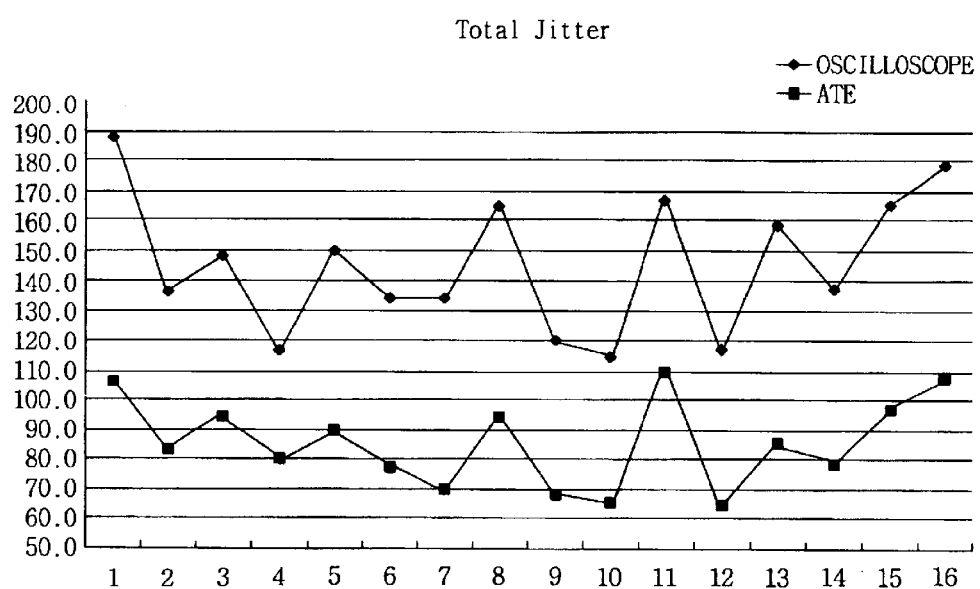
FIG. 6 is a graph for comparing total jitter measurement data with a measuring instrument's measured data in accordance with the present invention.

FIG. 6 is a graph that compares measured data in the present invention. In FIG. 6, the horizontal axis indicates sample data; 16 sample data were measured in this example. The vertical axis represents time in units of picoseconds. Herewith the measured object of jitter is 2.125 BPS SERDES of 10 bit. Further the high speed differential comparator 21 shown in FIG. 2 was set, and pattern data of "0101010101" was applied through an output terminal DSO of the test device 31. In such a case, when the undersampling period was determined as 8 bits as shown in FIG. 5 and the total jitter was measured, its result was represented in a lower graph of FIG. 6. Meanwhile, the eye-jitter value represented by an eye-diagram through the DSO (Digital Sampling Oscilloscope) is represented in an upper graph of FIG. 6. That is, the upper graph of FIG. 6 is the eye-jitter value using the DSO, and the lower graph is the total jitter data based on the present invention using the high speed differential comparator. In comparing the graphs with each other, absolute values of the total jitter are not equal but resemble each other. In other words, they have a mutually consistent tendency. The absolute values of total jitter substantially have some difference according to the type of instrument used in measuring the jitter. Accordingly, in the system and method of the present invention, total jitter can be measured rapidly and accurately, without the need for an additional high-cost measuring instrument.

As described above, in the system and method of measuring the total jitter by using the high speed differential comparator in accordance with the present invention, a comparatively accurate measurement of total jitter can be gained in a relatively short time with relatively small expense.

In accordance with the present invention, in a jitter measuring system of a high speed data output device and a total jitter measuring method, there is an advantage of measuring total jitter of high speed data over 2.0 Gbps comparatively in a short time, even without employing a high-cost measuring instrument. In addition, even data dependent jitter(DDJ), which has an important influence upon the characteristic of the total jitter, can be measured exactly.

While this invention has been particularly shown and described with references to preferred embodiments thereof, it will be understood by those skilled in the art that various changes in form and details may be made herein without departing from the spirit and scope of the invention as defined by the appended claims.

For example, the data pattern used for jitter testing, and the undersampling rate of the comparator clock can be modified, while still achieving the objects of the present invention.

What is claimed is:

1. A system for measuring jitter in a high speed data processing device, comprising:
   a high speed data processing device as an object under test, the high speed data processing device receiving test data and generating differential output data having positive and negative components at a high rate;
   a test device for providing the test data to the high speed data processing device and for providing a comparison operation reference clock; and
   a high-speed differential comparator coupled between the high speed data processing device and the test device, for comparing the positive component of the differential output data of the high speed data processing device to the negative component of the differential output data of the high speed data processing device in response to the comparison operation reference clock.

2. The system of claim 1, wherein said comparison operation reference clock has a clock rate that is less than the rate of the output rate of the differential output data, such that the comparison operation reference clock undersamples the output data.

3. The system of claim 1, wherein said high speed data processing device comprises a converter for converting parallel data into serial data.

4. The system of claim 1, wherein said test device captures comparison output data undersampled by the high speed comparator, and, in response, measures total jitter.

5. The system of claim 1, wherein the comparison operation reference clock operates at a frequency that is determined as $1/[I*(n-K)*period\ per\ 1\ bit]$ in testing an n-bit high speed data processing device, where I is an integer greater than 1, and where K is an even-order integer less than n, in order to overlap and capture data of mutually different bits.

6. The system of claim 1, wherein the test data comprises data wherein binary values of "1" and "0" are alternatively repeated, so as to generate repetitive differential output data.

7. A method of measuring a total jitter in a high speed data processing device, comprising the steps of:
- coupling a differential comparator to a differential output terminal of the high speed data processing device;
- applying test data to the high speed data processing device so as to generate alternating differential output data having positive and negative components at the differential output terminal;
- setting an operating period of the differential comparator to more than one output period of the alternating differential output data output by the differential output terminal, so as to undersample the positive and negative components of the differential output data of the high speed data processing device to generate undersampled comparison data, the comparator comparing the positive component of the differential output data of the high speed data processing device to the negative component of the differential output data of the high speed data processing device; and
- overlapping and capturing data of bits of the undersampled comparison data in order to measure the total jitter of the high speed data processing device.

8. The method of claim 7, further comprising converting parallel data into serial data at the high speed data processing device.

9. The method of claim 7, wherein the operating period is determined by a reference clock that is applied to the differential comparator and that operates at a frequency that is determined as $1/[I*(n-K)*period\ per\ 1\ bit]$ in testing an n-bit high speed data processing device, where I is an integer greater than 1, and where K is an even-order integer less than n, in order to overlap and capture data of mutually different bits.

10. The method of claim 7, wherein the test data comprises data wherein binary values of "1" and "0" are alternatively repeated, so as to generate repetitive differential output data.

11. A system for measuring jitter in a high speed data processing device, comprising:
- a high speed data processing device as an object under test, the high speed data processing device receiving test data and generating differential output data at a high rate;
- a test device for providing the test data to the high speed data processing device and for providing a comparison operation reference clock, the comparison operation reference clock operating at a frequency that is determined as $1/[I*(n-K)*period\ per\ 1\ bit]$, where the high speed data processing device is an n-bit device, where I is an integer greater than 1, and where K is an even-order integer less than n, in order to overlap and capture data of mutually different bits; and
- a high-speed differential comparator coupled between the high speed data processing device and the test device, for comparing the differential output data of the high speed data processing device in response to the comparison operation reference clock.

* * * * *